United States Patent
Ungar et al.

(10) Patent No.: US 6,865,209 B2
(45) Date of Patent: Mar. 8, 2005

(54) LASER DIODE WITH A SPATIALLY VARYING ELECTROSTATIC FIELD FREQUENCY CONVERTER

(75) Inventors: Jeffrey E. Ungar, Valley Village, CA (US); Robert M. Lammert, Monrovia, CA (US)

(73) Assignee: Quintessence Photonics Corporation, Sylmar, CA (US)

( * ) Notice: Subject to any disclaimer, the term of this patent is extended or adjusted under 35 U.S.C. 154(b) by 0 days.

(21) Appl. No.: 10/783,756

(22) Filed: Feb. 20, 2004

(65) Prior Publication Data

US 2004/0202208 A1 Oct. 14, 2004

Related U.S. Application Data

(60) Provisional application No. 60/449,667, filed on Feb. 24, 2003.

(51) Int. Cl.[7] .................................................. H01S 5/00
(52) U.S. Cl. ...................................................... 372/50
(58) Field of Search ........................ 372/21–23, 26–28, 372/43–50, 96, 108

(56) References Cited

U.S. PATENT DOCUMENTS

| | | | | |
|---|---|---|---|---|
| 4,751,710 A | * | 6/1988 | Yamaguchi et al. | 372/50 |
| 4,803,686 A | * | 2/1989 | Brock | 372/44 |
| 4,903,341 A | * | 2/1990 | Rice | 398/204 |
| 5,007,066 A | * | 4/1991 | Eda | 372/108 |
| 5,043,993 A | * | 8/1991 | Golio et al. | 372/38.1 |
| 5,732,102 A | * | 3/1998 | Bouadma | 372/96 |
| 5,832,009 A | * | 11/1998 | Kikuchi | 372/21 |

* cited by examiner

Primary Examiner—Quyen Leung
(74) Attorney, Agent, or Firm—Irell & Manella LLP

(57) ABSTRACT

A semiconductor diode laser that generates light at wavelengths longer than conventional diode lasers. The laser includes a first gain element that generates a first "pump" laser beam having a first frequency and a second gain element that generates a second "pump" laser beam having a second frequency. A nonlinear frequency conversion section mixes the two beams to generate a third co-propagating optical beam at the difference frequency. To improve efficiency, the frequency conversion section is furnished with an array of charged electrodes that spatially modulate the nonlinear susceptibility and phase-match the three beams.

26 Claims, 1 Drawing Sheet

LASER DIODE WITH A SPATIALLY VARYING ELECTROSTATIC FIELD FREQUENCY CONVERTER

REFERENCE TO CROSS-RELATED APPLICATION

This application claims priority to provisional Application No. 60/449,667, filed on Feb. 24, 2003.

BACKGROUND OF THE INVENTION

1. Field of the Invention

The subject matter disclosed generally relates to the field of semiconductor lasers.

2. Background Information

Conventional laser diodes, which are fabricated from III-V compound semiconductors such as GaAlAs, InGaAlP and InGaAsP operate at wavelengths between 0.4 and 1.6 $\mu$m. Longer wavelengths in the mid-infrared range between 2 and 10 $\mu$m are required for important applications, including:

Optical communications in the open atmosphere, which are highly vulnerable to scattering by fog and rain at conventional diode wavelengths shorter than 2 $\mu$m. By contrast, the atmosphere is much more transparent to wavelengths around 10 $\mu$m, where attenuation through fog can be as much as 150 db/km lower.

Measures to protect civilian and military aircraft from attack by shoulder-fired missiles, which use transmission of optical pulses in the 2 to 4.5 $\mu$m band to confuse their heat-seeking guidance systems.

The presence of chemical weapons such as nerve agents, as well as environmental pollutants can be sensitively detected by monitoring atmospheric absorption of mid-infrared laser beams.

There are unfortunately no practical laser diodes in this wavelength region. Diodes using Quantum Cascade designs have been demonstrated, but these have very low efficiency and require cryogenic cooling that makes them impractical for most applications.

It would be desirable to provide a semiconductor laser that efficiently generates light in the mid-range of infrared without some or all of the drawbacks found in prior art devices.

BRIEF SUMMARY OF THE INVENTION

A semiconductor laser diode that includes at least one gain element for generating two co-propagating laser beams with distinct optical frequencies. The laser diode includes a nonlinear optical element that mixes the two beams and creates a polarization wave having a third optical frequency, and an array of electrodes that induce a spatially alternating electric field that phase matches the polarization wave to a third light beam with the third optical frequency.

DETAILED DESCRIPTION

Figure 1:
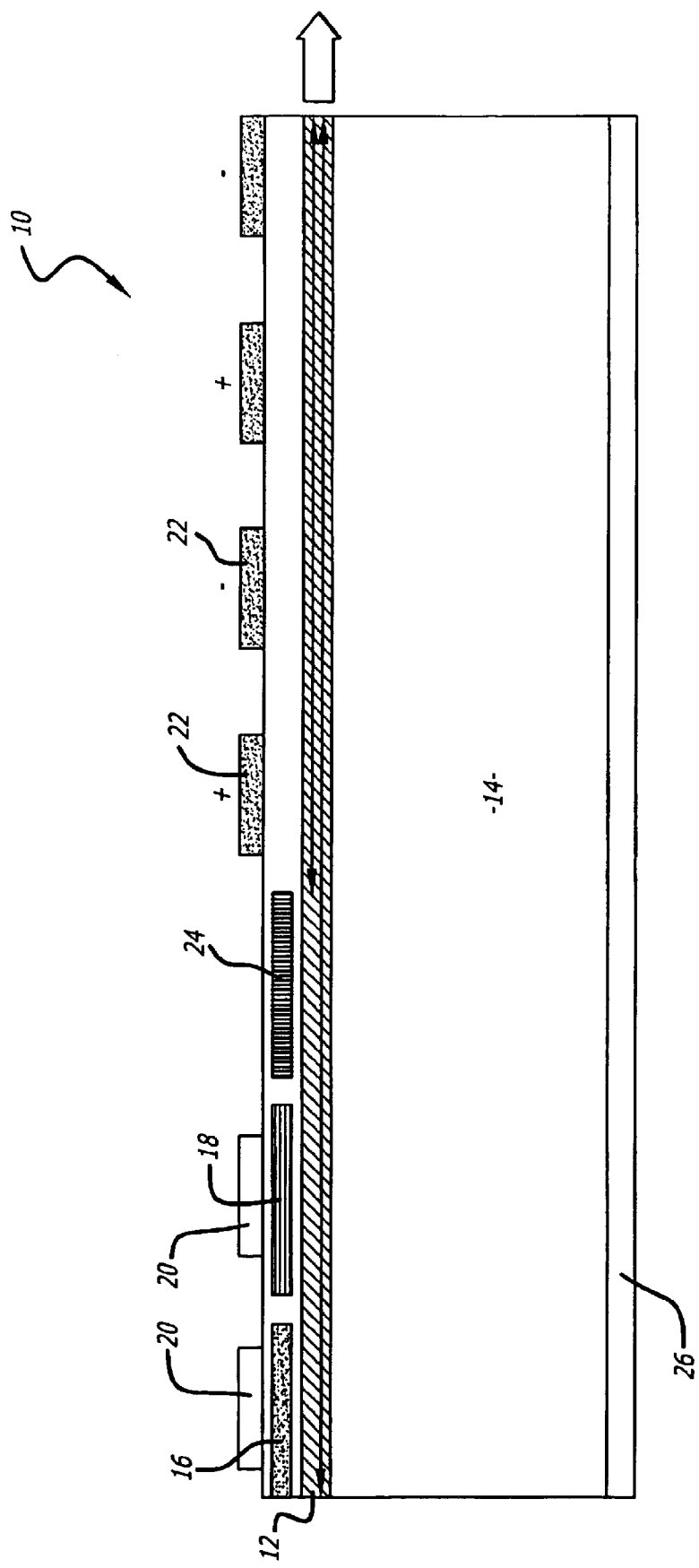
FIG. 1 is an illustration showing a side sectional view of a semiconductor laser.

Disclosed is a semiconductor diode laser that generates light at wavelengths longer than conventional diode lasers. The laser includes a first gain element that generates a first "pump" laser beam having a first frequency and a second gain element that generates a second "pump" laser beam having a second frequency. A nonlinear frequency conversion section mixes the two beams to generate a third co-propagating optical beam at the difference frequency. To improve efficiency, the frequency conversion section is furnished with an array of charged electrodes that spatially modulate the nonlinear susceptibility and phase-match the three beams.

FIG. 1 shows a laser 10 that generates a beam of light typically at mid-infrared frequencies between 2 and 10 $\mu$m. Laser 10 consists of semiconductor optical waveguide 12 and adjacent optical gain sections 16 and 18 fabricated on top of semiconductor substrate 14. Optical waveguide 12 and gain sections 16 and 18 are fabricated from epitaxial multi-layers of semiconductors such as InGaAsP and AlGaAs, as is well known in the art. Optical gain sections 16 and 18 have alloy compositions and incorporate epitaxial layers of p and n-type semiconductors such that optical gain is generated at two distinct wavelengths when electrical current is flowed through these sections.

Gain elements 16 and 18 may each incorporate a feedback element such as a diffraction grating (not shown) to support laser oscillation at the first and second frequencies. Alternatively, feedback to support laser oscillation at the first and second frequencies may be provided by Fresnel reflection from each end of the optical waveguide 12.

Additionally, gain elements 16 and 18 may be provided with metallic electrical contacts 20 to facilitate the flow of electrical current.

When current flows through elements 16 and 18, optical gain is provided at two distinct wavelengths. As a result, laser beams at the gain frequencies of elements 16 and 18 which propagate along the length of optical waveguide 12 are generated. Because the optical nonlinearities in the semiconductor construction materials of waveguide 12 are much stronger even than conventional nonlinear crystals such as Lithium Niobate, these "pump" beams mix to create a strong spatially periodic wave of electrical polarization oscillating at the difference frequency of the first two beams.

By way of example, if the first gain element 16 provides gain at 250 THz (1.2 $\mu$m) and the second gain element 18 at 182 THz (1.65 $\mu$m), a wave of polarization in waveguide 12 is generated at the difference frequency of 68 THz (4.4 $\mu$m).

Waveguide 12 incorporates an array of electrodes 22 that are connected to a DC voltage source (not shown). As indicated by the + and − signs in the FIGURE, the polarities of adjacent electrodes 22 alternate between positive and negative relative to a bottom contact 26. This creates a spatially periodic electrostatic field in waveguide 12 polarized primarily in the vertical direction, which because of the third-order nonlinearity spatially modulates the effective second-order nonlinearity of the waveguide. By choosing the pitch of electrode array 22 to quasi-phase match the polarization wave to a co-propagating electromagnetic wave at the difference frequency, an output laser beam at the difference frequency is generated which exits from the laser facet. The modulation and resultant mixing of beams can be further explained with the following equations.

Let the spatial and time dependence of the electrical fields of the first and second light beams be described by the following two wave equations, respectively:

Beam 1: $E_1 \cos(k_1 X - \omega_1 t)$ (1)

Beam 2: $E_2 \cos(k_2 X - \omega_2 t)$ (2)

Where;

$E_1$ = electric field amplitude of the first light beam.

$E_2$=electric field amplitude of the second light beam.
$k_1$=propagation number of the first light beam.
$k_2$=propagation number of the second light beam.
$\omega_1$=frequency of the first light beam.
$\omega_2$=frequency of the second light beam.

The first and second light beams mix within the waveguide 12 and generate a polarization density wave. The nonlinear polarization density induced by the mixing of the first and second light beams is defined by the equation:

$$P_{n1} = dE_1 E_2 \cos((k_1-k_2)X - \omega_3 t) \quad (3)$$

where
d=second-order nonlinear coefficient, and
$\omega_3 = \omega_3 = \omega_1 - \omega_2$ is the frequency of the third light beam (difference between pump frequencies).

It is desired to generate a third light beam defined by the equation:

$$\text{Beam 3: } E_3 \cos(k_3 X - \omega_3 t) \quad (4)$$

Where;
$E_3$=amplitude of the third light beam.
$k_1$=propagation number of the third light beam.
$\omega_3$=frequency of the third light beam.

If the nonlinear susceptibility d is spatially constant, the induced polarization has a propagation number $(k_1-k_2)$ that is not equal to $k_3$, and frequency conversion is very inefficient. To equate $(k_1-k_2)$ with $k_3$, the spatially varying electric field generated by electrodes 22 periodically modulates the effective second-order nonlinearity, which is represented by $$d = d_0 \cos((k_3 - (k_1-k_2))x) \quad (5)$$

Substituting equation (5) into equation (3) shows that a wave of polarization is generated with space and time dependence:

$$P_{n1} = \tfrac{1}{2} * d_0 E_1 E_2 \cos(k_3 X - \omega_3 t) + \text{out of phase terms} \quad (6)$$

Comparison with the form of the electric field in equation (4) shows that the polarization wave is phase matched to the electromagnetic wave.

By way of example, the electrode pitch may range between 2 to 4 $\mu$m, the converter length may range between 5–10 mm, and the voltage on electrodes 22 may be in the range of 10–20 volts.

Waveguide 12 may include a diffraction grating 24 reflector tuned to the difference frequency interposed between gain sections 16 and 18 on one hand, and electrodes 22 on the other hand, in order to isolate the third light beam from the first 16 and second 18 gain elements. This is desirable, because absorption of the third beam in absorptive sections 16 and 18 would reduce efficiency.

To improve efficiency, it will in general be desirable to resonantly enhance the nonlinear conversion process by providing strong optical feedback at all three frequencies. This can be done by suitably coating the laser facets, or by providing suitable Bragg gratings (not shown) as is well known in the art.

Although it desirable in order to reduce the drive current requirements, it is not absolutely necessary to include second gain section 18. If sufficient gain is provided by gain section 16 and sufficient optical feedback is provided, a pump beam at the second frequency will be generated by the well known process of Optical Parametric Oscillation.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A semiconductor laser, comprising:
   a first optical gain element that generates a first light beam having a first optical frequency;
   a second optical gain element that generates a second light beam having a second optical frequency;
   a nonlinear optical element that is coupled to said first and second optical elements and mixes the first and second high beams to create a polarization wave having a third optical frequency; and,
   a plurality of electrical contacts that generate a spatially alternating electric field that phase matches the polarization wave to generate a third light beam having the third optical frequency.

2. The laser of claim 1, wherein the third optical frequency is in a range from the Infrared to the THz regions.

3. The laser of claim 1, wherein said electrical contacts have opposite polarities.

4. The laser of claim 1, wherein said nonlinear optical element includes a waveguide optically coupled to said first and second gain elements.

5. The laser of claim 1, further comprising a diffraction grating tuned to the third optical frequency of the third light beam.

6. The laser of claim 1, wherein the semiconductor laser is fabricated with group III–V material.

7. The laser of claim 6, wherein the spatially alternating electric field modulates a nonlinear susceptibility of the group III–V material.

8. A semiconductor laser, comprising:
   gain means for generating a first light beam having a first frequency and a second light beam having a second frequency;
   mixing means for mixing the first and second light beams and creating a polarization wave having a third optical frequency; and,
   matching means for generating a spatially alternating electric field and phase matching the polarization wave to a third light beam at the third optical frequency.

9. The laser of claim 8, wherein the third frequency is in a range from the Infrared to the THz regions.

10. The laser of claim 8, wherein said matching means includes a plurality of electrodes that have opposite polarities.

11. The laser of claim 8, wherein said mixing means includes a waveguide.

12. The laser of claim 8, further comprising a diffraction grating tuned to the third optical frequency of the third light beam.

13. The laser of claim 8, wherein the semiconductor laser is fabricated with group III–V material.

14. The laser of claim 13, wherein the spatially alternating electric field modulates a nonlinear susceptibility of the group III–V material.

15. A method for operating a semiconductor laser, comprising:
   generating a first light beam having a first frequency;
   generating a second light beam having a second frequency;
   mixing the first and second light beams to generate polarization wave having a third optical frequency, and, generating a spatially varying electrostatic field that phase matches the polarization wave to a third light beam with the third optical frequency.

16. The method of claim 15, wherein the third optical frequency is in a frequency from the Infrared to the THz regions.

17. The method of claim 15, wherein the first and second light beams travel along a waveguide.

18. The method of claim 15, wherein the spatially alternating electric field is generated by a plurality of electrodes having opposite polarities.

19. The method of claim 15, wherein the spatially alternating electric field modulates a nonlinear susceptibility of a material of the semiconductor laser.

20. A semiconductor laser, comprising:
   a first optical gain element that generates a first light beam having a first frequency;
   a nonlinear optical element to pump the first light beam to create a polarization wave having a second optical frequency and a third optical frequency by optical parametric oscillation; and,
   a plurality of electrical contacts that generate a spatially alternating field that phase matches the polarization wave to the third optical frequency.

21. The laser of claim 20, wherein the third optical frequency is in a range from the Infrared to the THz regions.

22. The laser of claim 20, wherein said electrical contacts have opposite polarities.

23. The laser of claim 20, wherein said nonlinear optical element includes a waveguide optically coupled to said first optical gain element.

24. The laser of claim 20, further comprising a diffraction grating tuned to the third optical frequency of the third light beam.

25. The laser of claim 20, wherein the semiconductor laser is fabricated with group III–V material.

26. The laser of claim 20, wherein the spatially alternating electric field modulates a nonlinear susceptibility of the group III–V material.

* * * * *